(12) United States Patent
Shin et al.

(10) Patent No.: US 10,847,572 B2
(45) Date of Patent: Nov. 24, 2020

(54) MICRO LED DISPLAY DEVICE AND METHOD OF FABRICATING THE SAME

(71) Applicant: LUMENS CO., LTD., Yongin-si (KR)

(72) Inventors: Eun Sung Shin, Yongin-si (KR); Dong Hee Cho, Yongin-si (KR); Yong Pil Kim, Yongin-si (KR); Myung Ji Moon, Yongin-si (KR); Han Beet Chang, Yongin-si (KR); Jae Soon Park, Yongin-si (KR)

(73) Assignee: LUMENS CO., LTD., Yongin-si (KR)

( * ) Notice: Subject to any disclaimer, the term of this patent is extended or adjusted under 35 U.S.C. 154(b) by 71 days.

(21) Appl. No.: 16/154,939

(22) Filed: Oct. 9, 2018

(65) Prior Publication Data

US 2019/0043916 A1 Feb. 7, 2019

Related U.S. Application Data

(63) Continuation of application No. 15/889,002, filed on Feb. 5, 2018, now Pat. No. 10,128,308.

(30) Foreign Application Priority Data

Apr. 25, 2017 (KR) ........................ 10-2017-0052792

(51) Int. Cl.
*H01L 25/18* (2006.01)
*H01L 27/15* (2006.01)
(Continued)

(52) U.S. Cl.
CPC .......... *H01L 27/156* (2013.01); *H01L 25/162* (2013.01); *H01L 25/18* (2013.01);
(Continued)

(58) Field of Classification Search
CPC ..... H01L 27/156; H01L 25/162; H01L 25/18; H01L 25/167; H01L 2924/12041;
(Continued)

(56) References Cited

U.S. PATENT DOCUMENTS 6,455,878 B1 9/2002 Bhat et al.
2009/0073079 A1 3/2009 Miller et al.
(Continued)

FOREIGN PATENT DOCUMENTS

CN 106157821 A 11/2016
CN 205863169 U 1/2017
(Continued)

OTHER PUBLICATIONS

Office Action dated Apr. 23, 2019 in corresponding Japanese patent application No. 2018-095661.

*Primary Examiner* — Selim U Ahmed
(74) *Attorney, Agent, or Firm* — Mei & Mark LLP

(57) ABSTRACT

The present invention relates to a puzzle-type micro light emitting diode (LED) display device which is capable of implementing a display having various sizes, the micro LED display device including: a micro LED panel in which a plurality of micro LED pixels is arranged in rows and columns; and a micro LED driving substrate (backplane) configured to include an active matrix (AM) circuit unit including a plurality of CMOS cells corresponding to the plurality of micro LED pixels, and a control circuit unit disposed in an outer region of the AM circuit unit, in which the control circuit unit is disposed to be adjacent to two sides among four sides of the micro LED panel.

20 Claims, 13 Drawing Sheets

(51) Int. Cl.
*H01L 25/16* (2006.01)
*H01L 23/00* (2006.01)
*H01L 27/12* (2006.01)

(52) U.S. Cl.
CPC ............ *H01L 24/16* (2013.01); *H01L 25/167* (2013.01); *H01L 27/1214* (2013.01); *H01L 2224/16148* (2013.01); *H01L 2924/12041* (2013.01); *H01L 2924/1426* (2013.01)

(58) Field of Classification Search
CPC ....... H01L 2224/16148; H01L 27/1214; H01L 2924/1426; H01L 24/16
See application file for complete search history.

(56) References Cited

U.S. PATENT DOCUMENTS

| | | |
|---|---|---|
| 2011/0254034 A1 | 10/2011 | Konsek et al. |
| 2013/0100181 A1 | 4/2013 | Choe et al. |
| 2018/0166615 A1 | 6/2018 | Takagishi |

FOREIGN PATENT DOCUMENTS

| | | |
|---|---|---|
| JP | 2001-176668 A | 6/2001 |
| JP | 2001-242831 A | 9/2001 |
| JP | 2002-108253 A | 4/2002 |
| JP | 2002-297064 A | 10/2002 |
| JP | 2003-031858 A | 1/2003 |
| JP | 2009-238964 A | 10/2009 |
| JP | 2011-527519 A | 10/2011 |
| JP | 2017-009725 A | 1/2017 |

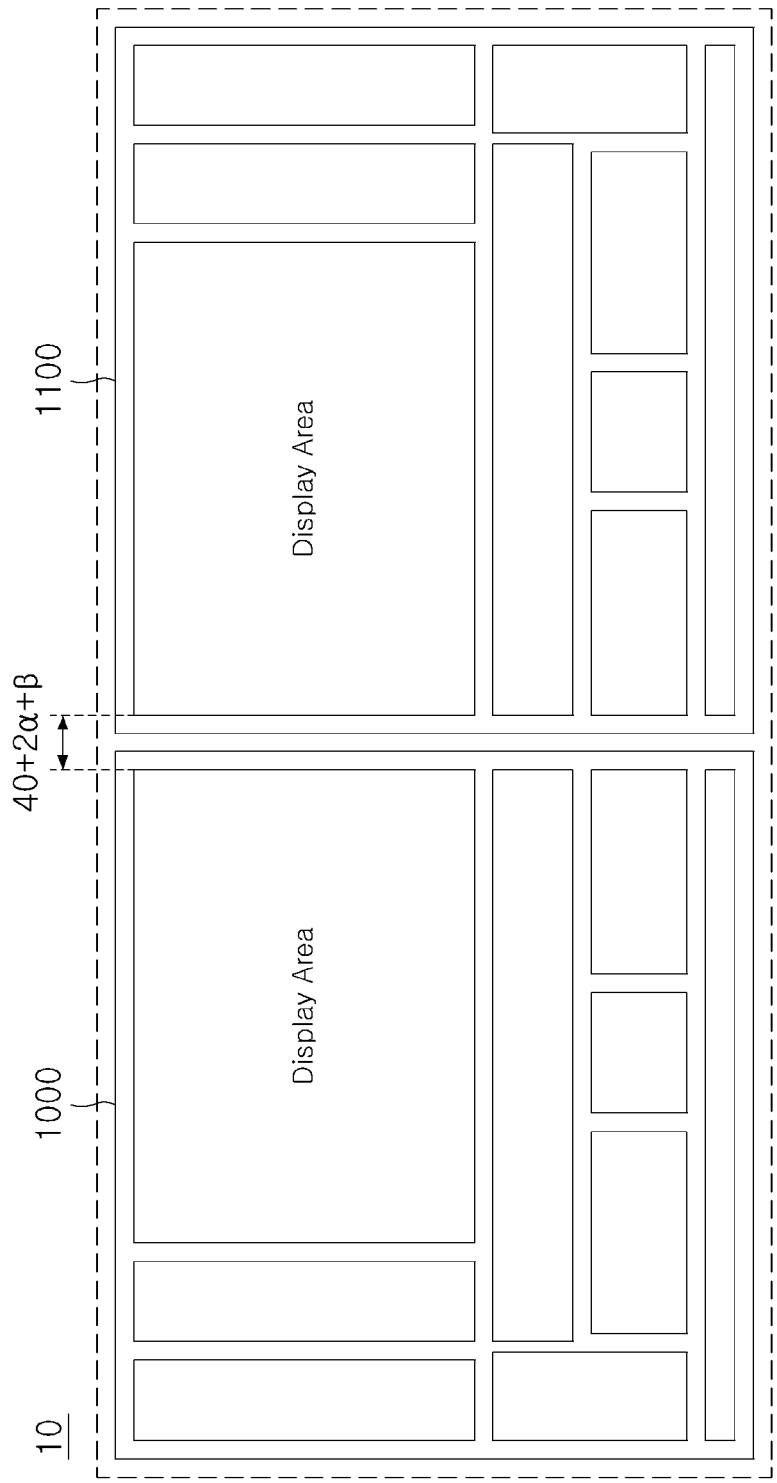

MICRO LED DISPLAY DEVICE AND METHOD OF FABRICATING THE SAME

CROSS-REFERENCE TO RELATED APPLICATIONS

This is a continuation of U.S. patent application Ser. No. 15/889,002, filed Feb. 5, 2018, which claims the priority benefit to Korean Patent Application No. 10-2017-0052792, filed in the Korean Intellectual Property Office on Apr. 25, 2017, the entire contents of which are incorporated herein by reference.

BACKGROUND OF THE DISCLOSURE

1. Field of the Disclosure

The present invention relates to a micro light emitting diode (LED) display device and a method of fabricating the same, and more particularly, to a micro LED display device which is capable of implementing a display of various sizes, and a method of fabricating the same.

2. Background of the Disclosure

A light emitting diode (LED) is a sort of semiconductor device which converts electric energy to light energy. The LED has advantages in low power consumption, semi-permanent life, high response speed, safety, and eco friendliness, compared to an existing light source, such as fluorescent light and incandescent light.

In this respect, a lot of research on replacement of the existing light source with the LED has been conducted, and there increases the case in which the LED is used as a light source of a lighting device, such as various lamps used in indoor and outdoor places, a liquid crystal display device, an electronic display, and a streetlamp.

Recently, an LED industry makes a new attempt to be applied to various industries beyond an existing traditional lighting range, and particularly, research is actively conducted in a low power driven flexible display field, an attachment-type information display device field for monitoring a human body, a vital reaction and deoxyribonucleic acid (DNA) sensing field, a bio convergence field for verifying effectiveness of optogenetics, and a photonics textile field in which a conductive fiber is combined with an LED light source.

In general, when an LED chip is fabricated in a size of several to several tens of micros which is small, it is possible to overcome a disadvantage in that the LED chip is broken when an inorganic material is bent according to a characteristic of the inorganic material, and it is possible to broadly apply the LED chip to various application fields up to a wearable device and a medical device for body insertion, as well as the foregoing flexible display, by giving flexibility by transferring the LED chip to a flexible substrate. However, when the LED light source is applied to the foregoing application fields, it is necessary to develop a light source which is thin and flexible, and has a size in a micro level, and in order to give flexibility to the LED, there is a demand for a process of transferring a separated thin film GaN layer to a flexible substrate in an individual or desired arrangement.

In the meantime, the micro LED technology in the related art succeeds in fabricating an LED pixel unit with a several micro size by a semiconductor process, but has a problem in that a size of a micro LED module is limited due to a limitation in a size of a wafer. Further, in a case of a product requiring a display having about 1.2 inch or more, a separate optical module is required, and this increases a size of the display module and decreases optical efficiency. Accordingly, it is necessary to develop a micro LED module which is capable of implementing a display of various sizes.

SUMMARY OF THE DISCLOSURE

An object of the present invention is to solve the foregoing problems and other problems. Another object of the present invention provides a micro light emitting diode (LED) display device which is capable of implementing a display of various sizes by changing a structure of a complementary metal-oxide semiconductor (CMOS) backplane, and a method of fabricating the same.

Another object of the present invention provides a micro LED display device which is capable of implementing a display of various sizes by changing a structure of a common electrode of a micro LED panel, and a method of fabricating the same.

An exemplary embodiment of the present invention provides a micro light emitting diode (LED) display device, including: a micro LED panel in which a plurality of micro LED pixels is arranged in rows and columns; and a micro LED driving substrate (backplane) configured to include an active matrix (AM) circuit unit including a plurality of CMOS cells corresponding to the plurality of micro LED pixels, and a control circuit unit disposed in an outer region of the AM circuit unit, in which the control circuit unit is disposed to be adjacent to two sides among four sides of the micro LED panel.

The effects of the micro LED display device and the method of fabricating the same according to the exemplary embodiments of the present invention will be described below.

According to at least one of the exemplary embodiments of the present invention, there is an advantage in that it is possible to implement a display having various sizes by changing a structure of a CMOS backplane used in a micro LED display device.

According to at least one of the exemplary embodiments of the present invention, there is an advantage in that it is possible to implement a display having various sizes by changing a structure of a common electrode of a micro LED panel used in a micro LED display device.

According to at least one of the exemplary embodiments of the present invention, there is an advantage in that it is possible to implement a display having various sizes by switching directions of a micro LED display device in a first type and a micro LED display device in a second type and combining the micro LED display device in the first type and the micro LED display device in the second type.

However, the effects achieved by the micro LED display device and the method of fabricating the same according to the exemplary embodiments of the present invention are not limited to the foregoing matters, and non-mentioned other effects may be clearly appreciated to those skilled in the art on the basis of the descriptions below.

BRIEF DESCRIPTION OF THE DRAWINGS

FIG. 12 is a diagram illustrating a micro LED display device in which a size of a display is enlarged two times in a horizontal direction.

DETAILED DESCRIPTION OF THE PREFERRED EMBODIMENTS

Figure 1:
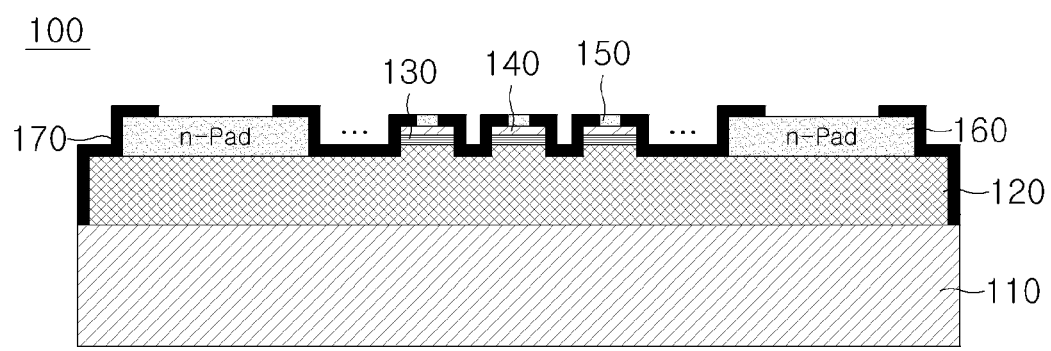
FIG. 1 is a cross-sectional view of a micro LED panel according to an exemplary embodiment of the present invention.

Hereinafter, exemplary embodiments disclosed in the present specification will be described in detail with reference to the accompanying drawings, and the same or similar constituent elements are denoted by the same reference numerals regardless of a sign of the drawing, and repeated description thereof will be omitted. Suffixes "module" and "unit" for constituent elements used in the description below are given or used together in consideration of only easiness of drafting the specification, and the suffixes "module" and "unit" themselves do not mean a discrimination therebetween or serve to discriminate from each other. That is, a term "~unit" used in the present invention means a hardware constituent element, such as software, a field programmable gate array (FPGA) or an application specific integrated circuit (FPGA), and the "~unit" performs specific functions. However, the "~unit" does not have meaning limited to software or hardware. The "~unit" may be configured to be present in an addressable storage medium or may also be configured to reproduce one or more processors. Accordingly, as an example, the "~unit" includes constituent elements, such as software constituent elements, object-oriented software constituent elements, class constituent elements, and task constituent elements, and processes, functions, attributes, procedures, sub-routines, segments of a program code, drivers, firmware, a micro code, a circuit, data, a database, data structures, tables, arrays, and variables. Functions provided within the constituent elements and the "~units" may be combined with the smaller number of constituent elements and "~units", or may be further separated to additional constituent elements and "~units".

Hereinafter, in the description of the exemplary embodiments of the present invention, a case where each layer (film), a region, a pattern, or structures are formed "on" or "under" a substrate, each layer (film), a region, a pad, or patterns includes all of the cases in which each layer (film), the region, the pattern, or the structures are directly formed "on" or "under" the substrate, each layer (film), the region, the pad, or the patterns, or intervening constituent elements are present. Further, a reference of "on" or "under" each layer is described with reference to the drawings. In the drawings, for convenience and clearness of description, a thickness or a size of each layer is exaggerated, omitted, or schematically illustrated. Further, a size of each constituent element does not totally reflect an actual size.

In describing the exemplary embodiments disclosed in the present specification, a detailed explanation of known related technology may be omitted so as to avoid unnecessarily obscuring the subject matter of the exemplary embodiments disclosed in the present specification. Further, the accompanying drawings are provided for helping easy understanding of the exemplary embodiments disclosed in the present specification, and the technical spirit disclosed in the present specification is not limited by the accompanying drawings, and it will be appreciated that the present invention includes all of the modifications, equivalent matters, and substitutes included in the spirit and the technical scope of the present invention.

The present invention provides a micro light emitting diode (LED) display device which is capable of implementing a display of various sizes by changing a structure of a complementary metal-oxide semiconductor (CMOS) backplane, and a method of fabricating the same. Hereinafter, in the present exemplary embodiment, a micro LED display device may be formed by flip-chip bonding a micro LED panel including a plurality of micro LED pixels and a CMOS backplane including a plurality of CMOS cells for independently driving the plurality of micro LED pixels through bumps.

Hereinafter, various exemplary embodiments of the present invention will be described in detail with reference to the drawings.

Figure 2:
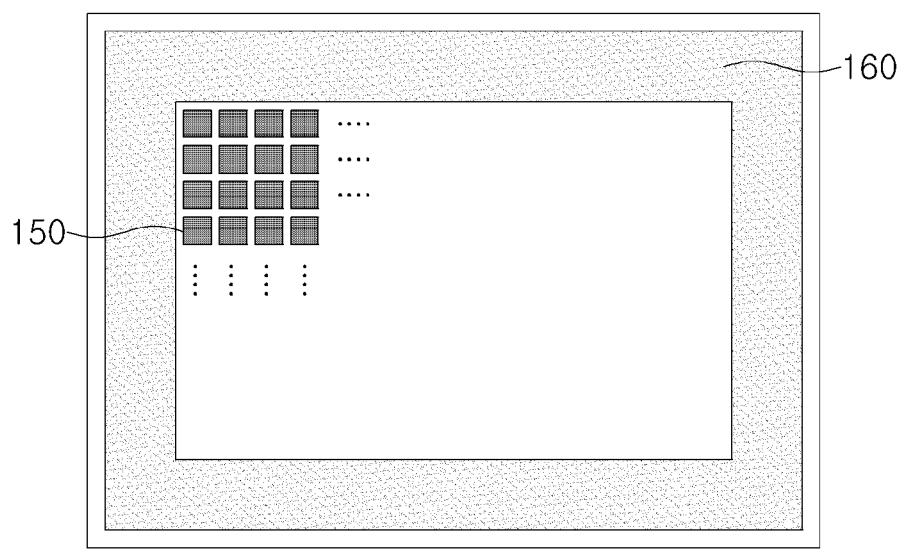
FIG. 2 is a top plan view of the micro LED panel according to the exemplary embodiment of the present invention.

FIG. 1 is a cross-sectional view of a micro LED panel according to an exemplary embodiment of the present invention, and FIG. 2 is a top plan view of the micro LED panel according to the exemplary embodiment of the present invention.

Referring to FIGS. 1 and 2, the micro LED panel (or the micro LED array) 100 according to the present invention is an LED panel including an array structure in which a plurality of LEDs (that is, a plurality of micro LED pixels) stacked on a wafer is arranged in a matrix form, and may serve to output light corresponding to an image signal of an image display device. In this case, the plurality of micro LED pixels is arranged on the wafer in rows and columns and each pixel has a size of several micro meters (μm).

The micro LED panel 100 may include a growth substrate 110, a first conductive semiconductor layer 120 on the growth substrate 110, an active layer 130 on the first conductive semiconductor layer 120, a second conductive semiconductor layer 140 on the active layer 130, a first conductive metal layer 160, a second conductive metal layer 150, and a passivation layer 170.

The growth substrate 110 may be formed of at least one of materials having transparency, for example, sapphire (Al$_2$O$_3$), a single crystal substrate, SiC, GaAs, GaN, ZnO, AlN, Si, GaP, InP, and Ge, but is not limited thereto.

The first conductive semiconductor layer 120 may include a compound semiconductor of III-V group elements in which an n-type dopant is doped. The first conductive semiconductor layer 120 may be selected from semiconductor materials, for example, InAlGaN, GaN, AlGaN, AlInN, InGaN, AlN, and InN, having an empirical formula of In$_x$Al$_y$Ga$_{1-x-y}$N (0≤x≤1, 0≤y≤1, 0≤x+y≤1), and an n-type dopant, such as Si, Ge, and Sn, may be doped.

The active layer 130 is a layer in which electrons (or holes) injected through the first conductive semiconductor layer 120 and holes (or electrons) injected through the second conductive semiconductor layer 140 meet to emit light by a difference in a band gap of an energy band according to a forming material of the active layer 130. The active layer 130 may be formed in any one of a single quantum well structure, a multi-quantum well (MQW) structure, a quantum dot structure, or a quantum wire structure, but is not limited thereto. The active layer 130 may be formed of a semiconductor material having an empirical formula of In$_x$Al$_y$Ga$_{1-x-y}$N (0≤x≤1, 0≤y≤1, 0≤x+y≤1). When the active layer 130 is formed in the MQW structure, the active layer 130 may be formed by alternately stacking a plurality of well layers and a plurality of barrier layers.

The second conductive semiconductor layer 140 may include a compound semiconductor of III-V group elements in which a p-type dopant is doped. The second conductive semiconductor layer 140 may be selected from semiconductor materials, for example, InAlGaN, GaN, AlGaN, InGaN, AlInN, AlN, and InN, having an empirical formula of In$_x$Al$_y$Ga$_{1-x-y}$N (0≤x≤1, 0≤y≤1, 0≤x+y≤1), and a p-type dopant, such as Mg, Zn, Ca, Sr, and Ba, may be doped.

The second conductive metal layer 150 (that is, a p electrode) may be formed on the second conductive semiconductor layer 140, and the first conductive metal layer 160 (that is, an n electrode) may be formed on the first conductive semiconductor layer 120.

For example, as illustrated in FIG. 2, the second conductive metal layer 150 may be disposed on the second conductive semiconductor layer 140 corresponding to each of the micro LED pixels, and may be electrically connected with each CMOS cell provided in a CMOS backplane through a bump.

The first conductive metal layer 160 may be disposed on mesa-etched regions of the first conductive semiconductor layer 120, and may be formed while being spaced apart from the plurality of micro LED pixels by a predetermined distance. The first conductive metal layer 160 may be formed on the first conductive semiconductor layer 120 so as to have a predetermined width along an outer region of the micro LED panel 100. A height of the first conductive metal layer 160 may be formed to be substantially the same as a height of the plurality of micro LED pixels. The first conductive metal layer 160 is electrically connected with a common cell of the CMOS backplane by the bump to serve as a common electrode of the micro LED pixels. For example, the first conductive metal layer 160 may be a common ground.

The first conductive metal layer 160 and the second conductive metal layer 150 provide power to the plurality of micro LED pixels formed in the micro LED panel 100.

The passivation layer 170 may be formed on at least one lateral surface of the first conductive semiconductor layer 120, the active layer 130, the second conductive semiconductor layer 140, and the first conductive metal layer 160, and the second conductive metal layer 150. The passivation layer 170 may be formed to electrically protect the emission structures 120, 130, and 140, and may be formed of, for example, SiO$_2$, SiO$_x$, SiO$_x$N$_y$, Si$_3$N$_4$, Al$_2$O$_3$, but is not limited thereto.

The LEDs (that is, the micro LED pixels) formed in the micro LED panel 100 may emit light of different wavelengths according to a composition ratio of a compound semiconductor. When the LEDs included in the micro LED panel 100 is red LED devices, the micro LED panel 100 may be a red LED panel. When the LEDs included in the micro LED panel 100 is green LED devices, the micro LED panel 100 may be a green LED panel. When the LEDs included in the micro LED panel 100 is blue LED devices, the micro LED panel 100 may be a blue LED panel. In the meantime, the micro LED panel 100 may also implement a full color by combining the plurality of LEDs outputting a specific wavelength with R/G/B fluorescent substances, R/G/B color filters, and the like.

The micro LED display device may be configured by flip-chip bonding the plurality of micro LED pixels formed in the micro LED panel 100 and the plurality of CMOS cells formed on the CMOS backplane by using the bumps so that the plurality of micro LED pixels corresponds one-to-one and connected to the plurality of CMOS cells. In this case, the first conductive metal layer 160 and the second conductive metal layer 150 formed in the micro LED panel 100 may be electrically connected with the CMOS backplane through the bumps.

FIGS. 3A to 3E are diagrams illustrating a method of fabricating the micro LED panel according to the exemplary embodiment of the present invention.

Figure 3A:
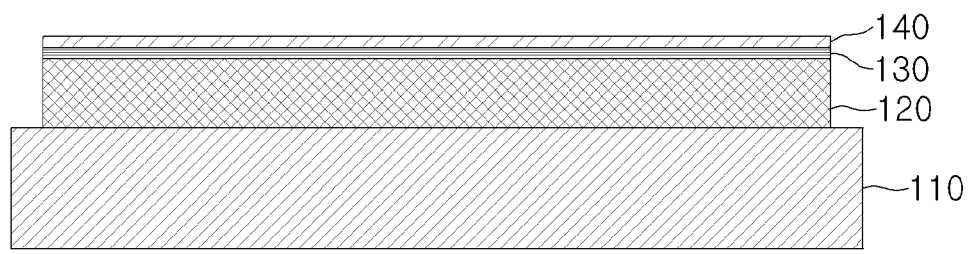
FIGS. 3A to 3E are diagrams illustrating a method of fabricating the micro LED panel according to the exemplary embodiment of the present invention.

Referring to FIG. 3A, the emission structures 120, 130, and 140 may be formed by sequentially growing the first conductive semiconductor layer 120, the active layer 130, and the second conductive semiconductor layer 140 on the growth substrate 110.

The growth substrate 110 may be formed of at least one of materials having transparency, for example, sapphire (Al$_2$O$_3$), a single crystal substrate, SiC, GaAs, GaN, ZnO, AlN, Si, GaP, InP, and Ge, but is not limited thereto.

The first conductive semiconductor layer 120 may be selected from semiconductor materials, for example, InAlGaN, GaN, AlGaN, AlInN, InGaN, AlN, and InN, having an empirical formula of In$_x$Al$_y$Ga$_{1-x-y}$N (0≤x≤1, 0≤y≤1, 0≤x+y≤1), and an n-type dopant, such as Si, Ge, and Sn, may be doped. The first conductive semiconductor layer 120 may be formed by injecting trimethyl gallium (TMGa) gas, ammonia (NH$_3$) gas, and xylene (SiH$_4$) gas to a chamber together with hydrogen gas. An undoped semiconductor layer (not illustrated) and/or a buffer layer (not illustrated) may be further included between the growth substrate 110 and the first conductive semiconductor layer 120, but the present invention is not limited thereto.

The active layer 130 may be formed of a semiconductor material having an empirical formula of In$_x$Al$_y$Ga$_{1-x-y}$N (0≤x≤1, 0≤y≤1, 0≤x+y≤1). The active layer 130 may be formed by injecting trimethyl gallium (TMGa) gas, trimethyl indium (TMIn) gas, and ammonia (NH$_3$) gas to a chamber together with hydrogen gas.

The second conductive semiconductor layer 140 may be selected from semiconductor materials, for example, InAlGaN, GaN, AlGaN, InGaN, AlInN, AlN, and InN, having an empirical formula of In$_x$Al$_y$Ga$_{1-x-y}$N (0≤x≤1, 0≤y≤1, 0≤x+y≤1), and a p-type dopant, such as Mg, Zn, Ca, Sr, and Ba, may be doped. The second conductive semiconductor layer 140 may be formed by injecting trimethyl gallium (TMGa)

gas, ammonia (NH$_3$) gas, and biacetyl cyclo penta dienyl magnesium (EtCp$_2$Mg){Mg(C$_2$H$_5$C$_5$H$_4$)$_2$} gas to a chamber together with hydrogen gas.

Figure 3B:
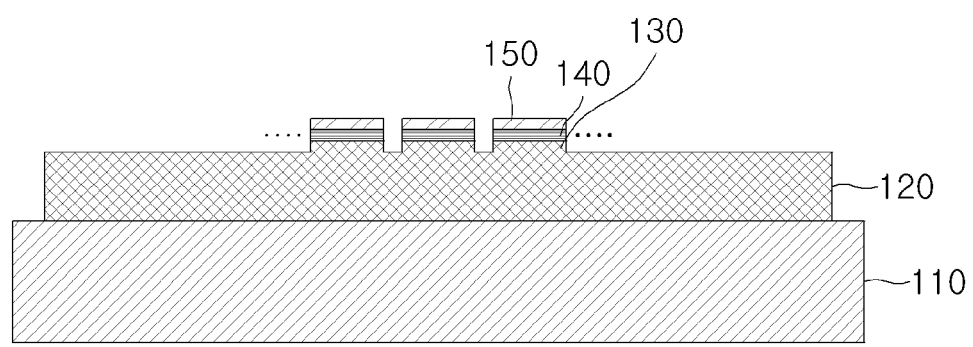

Referring to FIG. 3B, a plurality of LEDs may be formed by performing an isolation etching process on the emission structures 120, 130, and 140 according to a unit pixel region. For example, the isolation etching may be performed by a dry etching method, such as inductively coupled plasma (ICP). One upper surface of the first conductive semiconductor layer 120 is exposed through the isolation etching process. In this case, in order to form the common electrode (that is, the n electrode) 160, the emission structures 120, 130, and 140 may be etched so that a border region of the first conductive semiconductor layer 120 has a predetermined width.

Figure 3C:
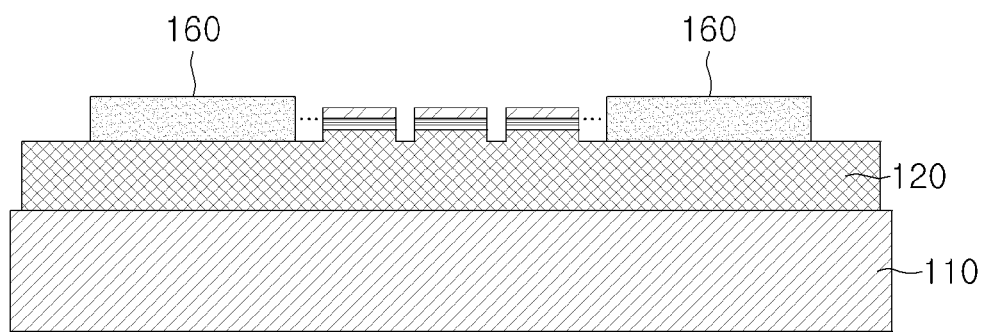
Figure 3D:
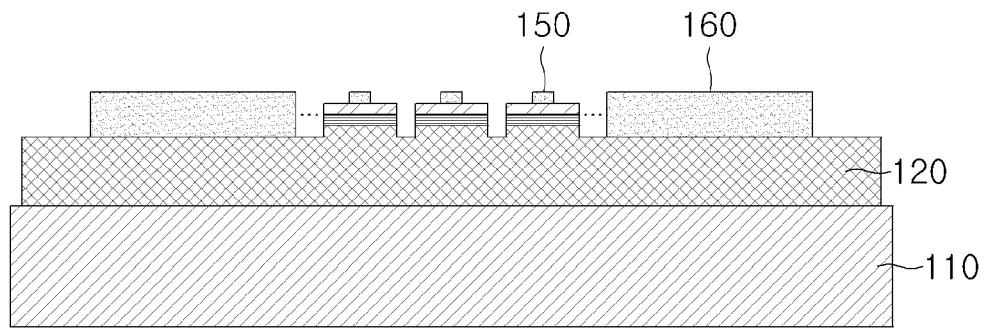

Referring to FIGS. 3C and 3D, the second conductive metal layer 150 may be formed on one upper surface of the second conductive semiconductor layer 140, and the first conductive metal layer 160 may be formed on one upper surface of the exposed first conductive semiconductor layer 120. In this case, the first and second conductive metal layers 160 and 150 may be formed by a deposition process or a plating process, but the present invention is not limited thereto.

Figure 3E:
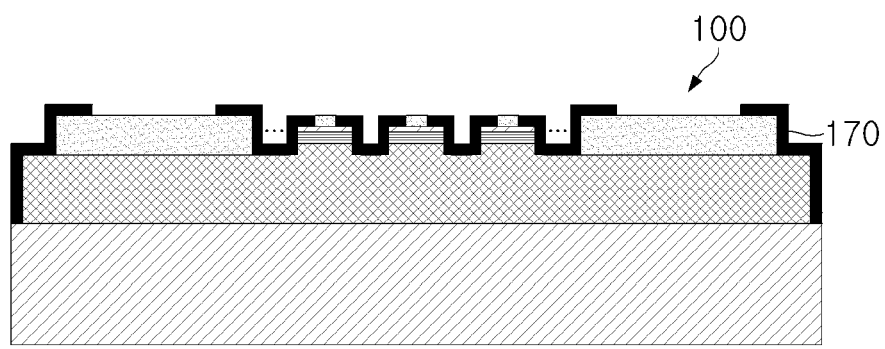

Referring to FIG. 3E, the passivation layer 170 may be formed on the growth substrate 110, the emission structures 120, 130, and 140, the first conductive metal layer 160, and the second conductive metal layer 150, and the passivation layer 170 may be selectively removed so that one upper surface of each of the first and second conductive metal layers 160 and 150 is exposed to the outside. Then, the micro LED display device may be formed by flip-chip bonding the micro LED panel 100 formed through the foregoing process and the CMOS backplane (not illustrated).

Figure 4:
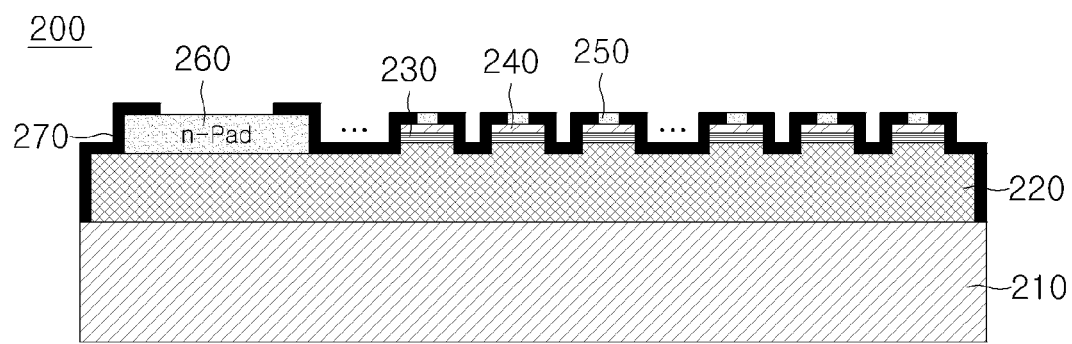
FIG. 4 is a cross-sectional view of a micro LED panel according to another exemplary embodiment of the present invention.
Figure 5:
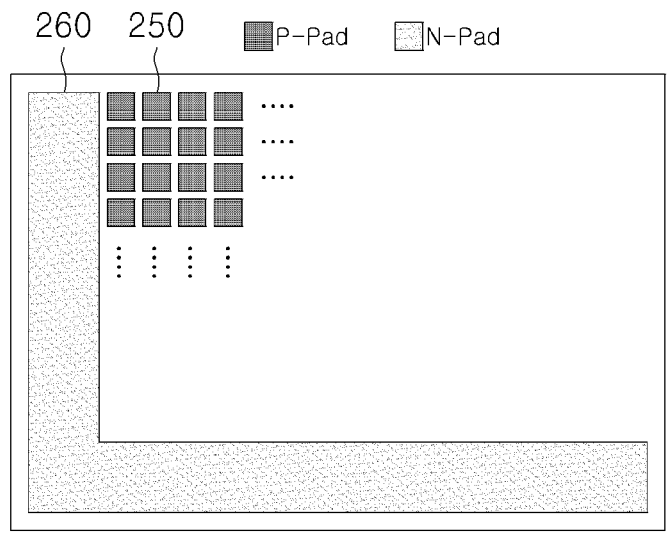
FIG. 5 is a top plan view of the micro LED panel according to another exemplary embodiment of the present invention.

FIG. 4 is a cross-sectional view of a micro LED panel according to another exemplary embodiment of the present invention, and FIG. 5 is a top plan view of the micro LED panel according to another exemplary embodiment of the present invention.

Referring to FIGS. 4 and 5, the micro LED panel 200 according to the present invention is an LED panel including an array structure in which a plurality of LEDs (that is, the plurality of micro LED pixels) stacked on a wafer is arranged in a matrix form, and may serve to output light corresponding to an image signal of an image display device.

The micro LED panel 200 may include a growth substrate 210, a first conductive semiconductor layer 220 on the growth substrate 210, an active layer 230 on the first conductive semiconductor layer 220, a second conductive semiconductor layer 240 on the active layer 230, a first conductive metal layer 260, a second conductive metal layer 250, and a passivation layer 270.

In the present exemplary embodiment, the growth substrate 210, the first conductive semiconductor layer 220, the active layer 230, the second conductive semiconductor layer 240, the first and second conductive metal layers 260 and 250, and the passivation layer 270 are similar to the growth substrate 110, the first conductive semiconductor layer 120, the active layer 130, the second conductive semiconductor layer 140, the first and second conductive metal layers 160 and 150, and the passivation layer 170 of FIG. 1, so that detailed descriptions thereof will be omitted, and the description will be given based on differences.

The second conductive metal layer 250 (that is, a p electrode) may be formed on the second conductive semiconductor layer 240, and the first conductive metal layer 260 (that is, an n electrode) may be formed on the first conductive semiconductor layer 220.

For example, as illustrated in FIG. 5, the second conductive metal layer 250 may be disposed on the second conductive semiconductor layer 240 corresponding to each of the micro LED pixels, and may be electrically connected with each CMOS cell provided in a CMOS backplane through a bump.

The first conductive metal layer 260 is formed so as to have a predetermined width along a left outer region and a lower outer region of an upper surface of the micro LED panel 200, and serves as a common electrode of the micro LED pixels. In the meantime, as another exemplary embodiment, the first conductive metal layer 260 is formed so as to have a predetermined width along a right outer region and a lower outer region of the upper surface of the micro LED panel 200, and serves as a common electrode of the micro LED pixels. The first and second conductive metal layers 260 and 250 provide power to the plurality of micro LED pixels formed in the micro LED panel 200.

The passivation layer 270 may be formed on at least one lateral surface of the first conductive semiconductor layer 220, the active layer 230, the second conductive semiconductor layer 240, the first conductive metal layer 260, and the second conductive metal layer 250. The passivation layer 270 may be formed to electrically protect the emission structures 220, 230, and 240, and may be formed of, for example, SiO$_2$, SiO$_x$, SiO$_x$N$_y$, Si$_3$N$_4$, Al$_2$O$_3$, but is not limited thereto.

The micro LED display device may be configured by flip-chip bonding the plurality of micro LED pixels formed in the micro LED panel 200 and the plurality of CMOS cells formed on the CMOS backplane by using the bumps so that the plurality of micro LED pixels corresponds one-to-one and connected to the plurality of CMOS cells. In this case, the first conductive metal layer 260 and the second conductive metal layer 250 formed in the micro LED panel 200 may be electrically connected with the CMOS backplane through the bumps.

FIGS. 6A to 6E are diagrams illustrating a method of fabricating the micro LED panel according to another exemplary embodiment of the present invention. Hereinafter, in the present exemplary embodiment, the method of fabricating the micro LED panel is similar to the method of fabricating the micro LED panel of FIGS. 3A to 3E, so that a detailed description thereof will be omitted, and the description will be given based on differences.

Figure 6A:
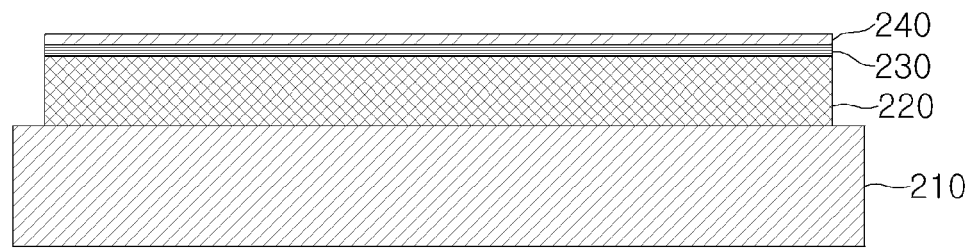
FIGS. 6A to 6E are diagrams illustrating a method of fabricating the micro LED panel according to another exemplary embodiment of the present invention.

Referring to FIG. 6A, the emission structures 220, 230, and 240 may be formed by sequentially growing the first conductive semiconductor layer 220, the active layer 230, and the second conductive semiconductor layer 240 on the growth substrate 210.

Figure 6B:
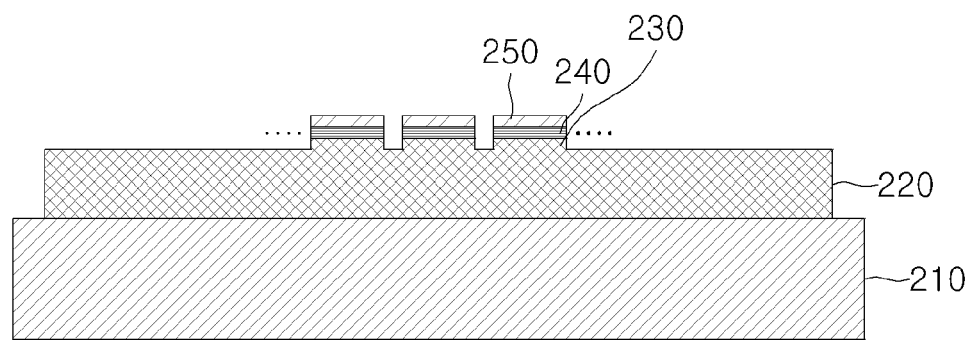

Referring to FIG. 6B, a plurality of LEDs (that is, the plurality of micro LED pixels) may be formed by performing an isolation etching process on the emission structures 220, 230, and 240 according to a unit pixel region. For example, the isolation etching may be performed by a dry etching method, such as inductively coupled plasma (ICP). One upper surface of the first conductive semiconductor layer 220 is exposed through the isolation etching process.

Figure 6C:
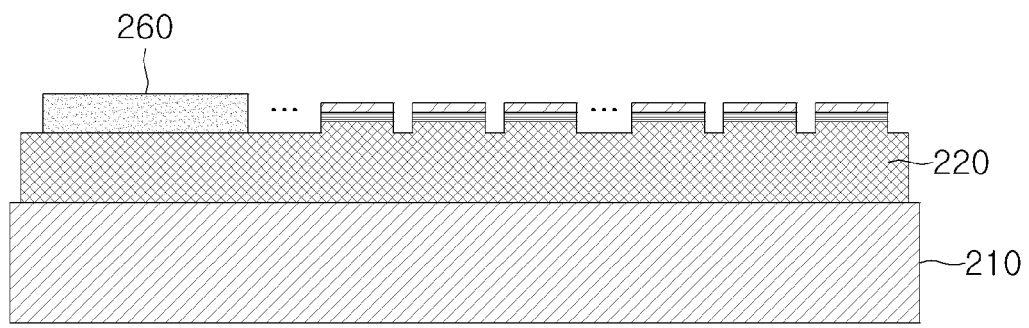
Figure 6D:
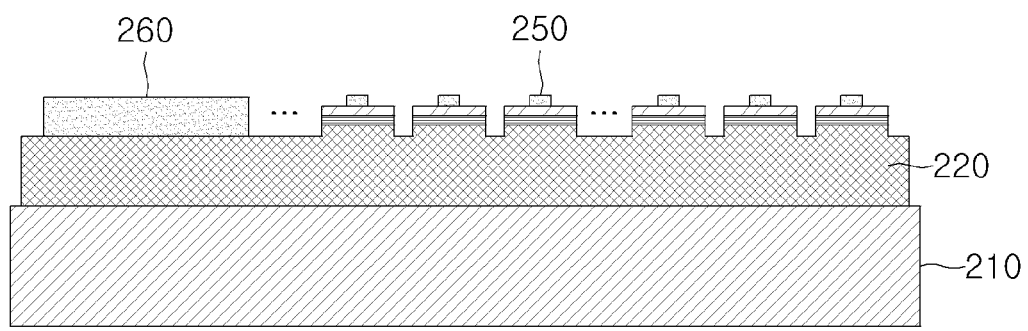

Referring to FIGS. 6C and 6D, the second conductive metal layer 250 may be formed on one upper surface of the second conductive semiconductor layer 240, and the first conductive metal layer 260 may be formed on one upper surface of the mesa-etched first conductive semiconductor layer 220. Unlike the manufacturing processes of FIGS. 3C and 3D, the first conductive metal layer 260 may be formed only in one side region of the first conductive semiconductor layer 220. In this case, the first and second conductive metal layers 260 and 250 may be formed by a deposition process or a plating process, but the present invention is not limited thereto.

Figure 6E:
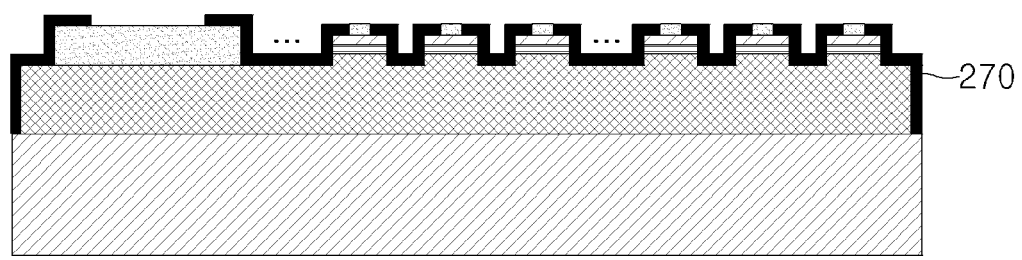

Referring to FIG. 6E, the passivation layer 270 may be formed on the growth substrate 210, the emission structures 220, 230, and 240, the first conductive metal layer 260, and the second conductive metal layer 250, and the passivation layer 270 may be selectively removed so that one upper surface of each of the first and second conductive metal layers 260 and 250 is exposed to the outside. Then, the micro LED display device may be formed by flip-chip bonding the micro LED panel 200 formed through the foregoing process and the CMOS backplane (not illustrated).

Figure 7:
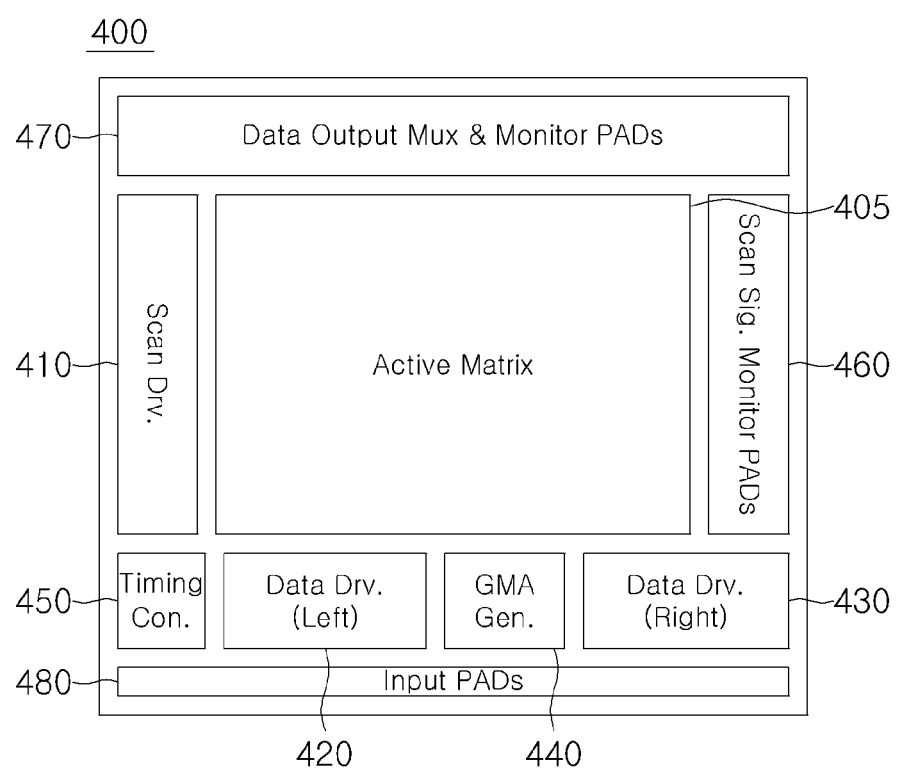
FIG. 7 is a diagram illustrating a structure of a general complementary metal-oxide semiconductor (CMOS) backplane used in a micro LED display device.

FIG. 7 is a diagram illustrating a structure of a general CMOS backplane used in a micro LED display device.

Referring to FIG. 7, a general CMOS backplane (or a micro LED driving substrate) 400 is disposed to face the micro LED panel 100, and may serve to drive the plurality of micro LED pixels provided in the micro LED panel 100 in response to an input image signal.

The CMOS backplane 400 may include an active matrix circuit unit 405 including the plurality of CMOS cells for individually driving the plurality of micro LED pixels, and control circuit units 410 to 480 disposed in an outer region of the active matrix circuit unit 405.

Each of the plurality of CMOS cells provided in the active matrix circuit unit 405 is electrically connected to the corresponding micro LED pixel through the bump. Accordingly, each of the plurality of CMOS cells may be a pixel driving circuit including two transistors and one capacitor, and when the micro LED panel 100 is flip-chip bonded to the CMOS backplane 400 by using the bumps, each of the plurality of CMOS cells may be configured in a form in which the individual micro LED pixel is disposed between a drain terminal and a common ground terminal of the transistor of the pixel driving circuit according to the equivalent circuit.

The CMOS backplane 400 includes a common cell (not illustrated) formed in a location corresponding to the first conductive metal layer 160 of the micro LED panel 100, and the first conductive metal layer 160 and the common cell are electrically connected through the bump.

The control circuit units may include a scan driving unit 410, a first data driving unit 420, a second data driving unit 430, a gamma voltage generating unit 440, a timing control unit 450, a scan signal monitor pad unit 460, a data output monitor pad unit 470, an interface pad unit 480, and the like.

The circuits 410 to 480 configuring the control circuit units may be disposed in regions adjacent to four sides (that is, upper/lower/left/right sides) of the active matrix circuit unit 405. For example, as illustrated in the drawing, the scan driving unit 410 may be disposed in a left region of the active matrix circuit unit 405, and the scan signal monitor pad unit 460 may be disposed in a right region of the active matrix circuit unit 405. Further, the data output monitor pad unit 470 may be disposed in an upper region of the active matrix circuit unit 405, and the first and second data driving units 420 and 320, the gamma voltage generating unit 440, the timing control unit 450, and the interface pad unit 480 may be disposed in a lower region of the active matrix circuit unit 405.

The scan driving unit 410 may sequentially generate a scan signal while shifting a level of the signal to a swing width of a gate driving voltage with which the transistors corresponding to the plurality of micro LED pixels are operable, in response to a gate timing control signal GDC supplied from the timing control unit 450. The scan driving unit 410 may supply the scan signal generated through a scan line to the plurality of micro LED pixels included in the micro LED panel 100.

The first and second data driving units 420 and 430 may sample and latch a data signal in the digital form supplied from the timing control unit 450 and convert the latched data signal to data in a parallel data system in response to a data timing control signal DDC supplied from the timing control unit 450. When the first and second data driving units 420 and 430 convert the data into the data in the parallel data system, the first and second data driving units 420 and 430 may convert the data signal in the digital form into a gamma reference voltage and output a data signal in the analog form. The first and second data driving units 420 and 430 may supply the data signal in the analog form to the plurality of micro LED pixels included in the micro LED panel 100 through data lines. Herein, the first data driving unit 420 may supply the data signal to the micro LED pixels present in the left region of the micro LED panel 100, and the second data driving unit 430 may supply the data signal to the micro LED pixels present in the right region of the micro LED panel 100.

The gamma voltage generating unit 440 may generate a gamma reference voltage and provide the generated gamma reference voltage to the first and second data driving units 420 and 430.

The timing control unit 450 may receive a vertical synchronization signal Vsync, a horizontal synchronization signal Hsync, a data enable signal DE, a clock signal CLK, a data signal DATA, and the like. The timing control unit 450 may control operation timing of the first and second data driving units 420 and 430 and the scan driving unit 410 by using the timing signal, such as the vertical synchronization signal Vsync, the horizontal synchronization signal Hsync, the data enable signal DE, the clock signal CLK, and the like.

The control signals generated in the timing control unit 450 may include the gate timing control signal GDC for controlling operation timing of the scan driving unit 410 and the data timing control signal DDC for controlling operation timing of the first and second data driving units 420 and 430.

The gate timing control signal GDC may include a gate start pulse GSP, a gate shift clock GSC, a gate output enable signal GOE, and the like. The data timing control signal DDC may include a source start pulse SSP, a source sampling clock SSC, a source output enable signal SOE, and the like.

The scan signal monitor pad unit 460 may include pads for detecting the scan signals output from the scan driving unit 410. The data output monitor unit 470 may include pads for multiplexing and detecting the data signals output from the first and second data driving units 420 and 430.

The interface pad unit 480 may include an RGB interface pad unit, a low voltage differential signaling (LVDS) interface pad unit, a serial peripheral interface (SPI) pad unit and the like as the pads for inputting outside signals.

A control operation of the micro LED panel 100 through the CMOS backplane 400 will be simply described. The scan driving unit 410 turns on the pixel by inputting a high (H) signal to any one or more of the scanning lines while scanning all of the scanning lines when image data is provided. In the meantime, when the first and second data driving units 420 and 430 supply the image data to the plurality of data lines, the micro LED pixels which are in the turn-on state in the scanning lines transmit the image data and enable the corresponding image data to be displayed through the micro LED panel 100. By this manner, a display for one frame is completed while all of the scanning lines are sequentially scanned.

The micro LED display device may be formed by flip-chip bonding the micro LED panel 100 onto the CMOS backplane 400.

Figure 8:
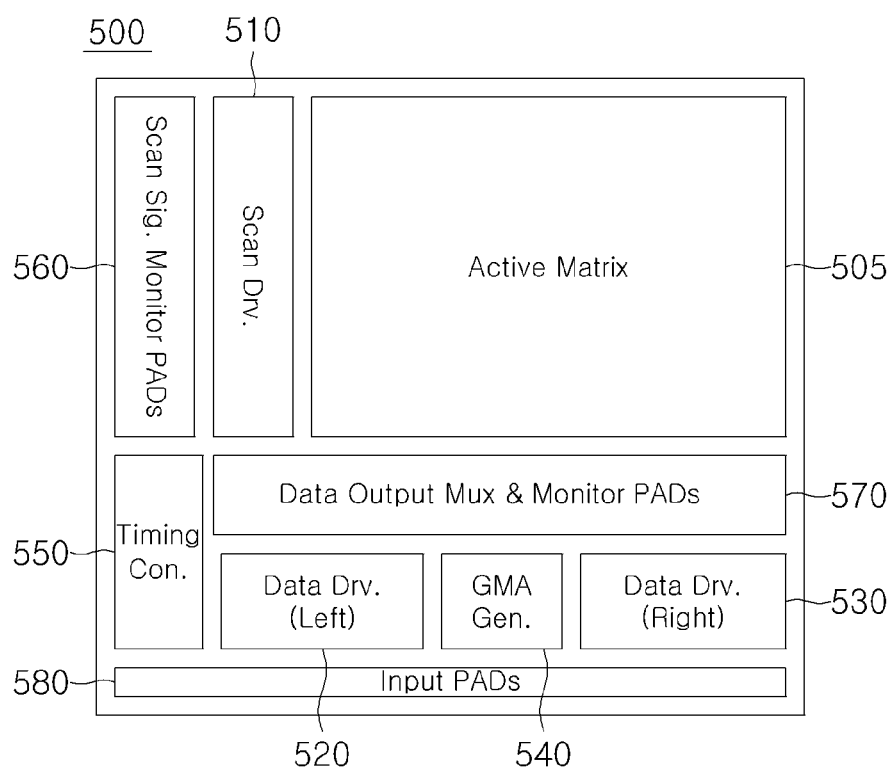
FIG. 8 is a diagram illustrating a structure of a CMOS backplane according to an exemplary embodiment of the present invention.

FIG. 8 is a diagram illustrating a structure of a CMOS backplane according to an exemplary embodiment of the present invention.

Referring to FIG. 8, a CMOS backplane (or a CMOS backplane in a first type) 500 according to an exemplary embodiment of the present invention may be disposed to face the micro LED panel 100 or 200, and serve to drive the plurality of micro LED pixels provided in the micro LED panel 100 or 200 in response to the input image signal.

The CMOS backplane 500 may include an active matrix circuit unit 505 including the plurality of CMOS cells for individually driving the plurality of micro LED pixels, and control circuit units 510 to 580 disposed in an outer region of the active matrix circuit unit 505.

Each of the plurality of CMOS cells provided in the active matrix circuit unit 505 is electrically connected to the corresponding micro LED pixel through the bump. The CMOS backplane 500 includes a common cell (not illustrated) formed in a location corresponding to the first conductive metal layer 160 or 260 of the micro LED panel 100 or 200, and the first conductive metal layer 160 or 260 and the common cell are electrically connected through the bump.

The control circuit units may include a scan driving unit 510, a first data driving unit 520, a second data driving unit 530, a gamma voltage generating unit 540, a timing control unit 550, a scan signal monitor pad unit 560, a data output monitor pad unit 570, an interface pad unit 580, and the like.

In the present exemplary embodiment, the scan driving unit 510, the first data driving unit 520, the second data driving unit 530, the gamma voltage generating unit 540, the timing control unit 550, the scan signal monitor pad unit 560, the data output monitor pad unit 570, and the interface pad unit 580 configuring the control circuit unit are the same as the scan driving unit 410, the first data driving unit 420, the second data driving unit 430, the gamma voltage generating unit 440, the timing control unit 450, the scan signal monitor pad unit 460, the data output monitor pad unit 470, and the interface pad unit 480 of FIG. 7, so that detailed descriptions thereof will be omitted.

In the meantime, unlike the general CMOS backplane 400 illustrated in FIG. 7, the circuits 510 to 580 configuring the control circuit unit according to the present exemplary embodiment may be disposed only in regions adjacent to a first side (that is, a left side) and a second side (that is, a lower side) of the active matrix circuit unit 505. In this case, the CMOS backplane 500 may use the common electrode (that is, the n electrode) on the micro LED panel 100 or 200 corresponding to the region in which the circuits 510 to 580 are disposed.

For example, as illustrated in the drawing, the scan driving unit 510 and the scan signal monitor pad unit 560 may be disposed in the left region of the active matrix circuit unit 505. More particularly, the scan driving unit 510 may be disposed just beside the active matrix circuit unit 505 and the scan signal monitor pad unit 560 may be disposed beside the scan driving unit 510.

The first and second data driving units 520 and 530, the gamma voltage generating unit 540, the data output monitor pad unit 570, the timing control unit 550, and the interface pad unit 580 may be disposed in the lower region of the active matrix circuit unit 505. More particularly, the data output monitor pad unit 570 may be disposed just under the active matrix circuit unit 505, the first and second data driving units 520 and 530 and the gamma voltage generating unit 540 may be disposed under the data output monitor pad unit 570, and the interface pad unit 580 may be disposed under the first and second data driving units 520 and 530 and the gamma voltage generating unit 540. Further, the timing control unit 550 may be disposed in the region adjacent to the data output monitor pad unit 570 and the first data driving unit 520.

In the meantime, the arrangement form and the detailed locations of the circuits 510 to 580 disposed to be adjacent to the two sides of the active matrix circuit unit 505 are not limited by the circuit disposition (or a lay out of the circuit) illustrated in the drawing, and it will be apparent to those skilled in the art that the locations of the circuits 510 to 580 may be slightly changed according to requirements of a customer company, design matters of a fabricating company, or the like.

The micro LED display device of a first type may be formed by flip-chip bonding the micro LED panel 100 or 200 onto the CMOS backplane 500. In this case, the micro LED display device of the first type may be fabricated with a maximum of 1.22 inches.

Figure 9:
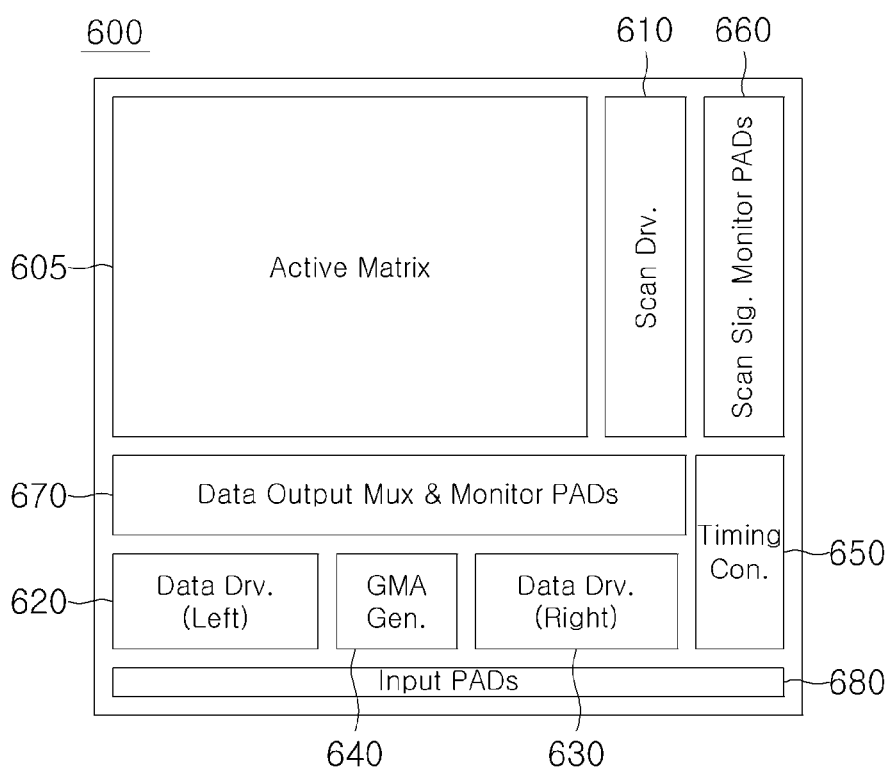
FIG. 9 is a diagram illustrating a structure of a CMOS backplane according to another exemplary embodiment of the present invention.

FIG. 9 is a diagram illustrating a structure of a CMOS backplane according to another exemplary embodiment of the present invention.

Referring to FIG. 9, a CMOS backplane (or a CMOS backplane in a second type) 600 according to another exemplary embodiment of the present invention may be disposed to face the micro LED panel 100 or 200, and serve to drive the plurality of micro LED pixels provided in the micro LED panel 100 or 200 in response to the input image signal.

The CMOS backplane 600 may include an active matrix circuit unit 605 including the plurality of CMOS cells for individually driving the plurality of micro LED pixels, and control circuit units 610 to 680 disposed in an outer region of the active matrix circuit unit 605.

Each of the plurality of CMOS cells provided in the active matrix circuit unit 605 is electrically connected to the corresponding micro LED pixel through the bump. The CMOS backplane 600 includes a common cell (not illustrated) formed in a location corresponding to the first conductive metal layer 160 or 260 of the micro LED panel 100 or 200, and the first conductive metal layer 160 or 260 and the common cell are electrically connected through the bump.

The control circuit units may include a scan driving unit 610, a first data driving unit 620, a second data driving unit 630, a gamma voltage generating unit 640, a timing control unit 650, a scan signal monitor pad unit 660, a data output monitor pad unit 670, an interface pad unit 680, and the like.

In the present exemplary embodiment, the scan driving unit 610, the first data driving unit 620, the second data driving unit 630, the gamma voltage generating unit 640, the timing control unit 650, the scan signal monitor pad unit 660, the data output monitor pad unit 670, and the interface pad unit 680 configuring the control circuit unit are the same as the scan driving unit 410, the first data driving unit 420, the second data driving unit 430, the gamma voltage generating unit 440, the timing control unit 450, the scan signal monitor pad unit 460, the data output monitor pad unit 470, and the interface pad unit 480 of FIG. 7, so that detailed descriptions thereof will be omitted.

In the meantime, unlike the general CMOS backplane 400 illustrated in FIG. 7, the circuits 610 to 680 configuring the control circuit unit according to the present exemplary embodiment may be disposed only in regions adjacent to a first side (that is, a right side) and a second side (that is, a lower side) of the active matrix circuit unit 605. In this case, the CMOS backplane 600 may use the common electrode (that is, the n electrode) on the micro LED panel 100 or 200 corresponding to the region in which the circuits 610 to 680 are disposed.

For example, as illustrated in the drawing, the scan driving unit 610 and the scan signal monitor pad unit 660 may be disposed in the right region of the active matrix circuit unit 605. More particularly, the scan driving unit 610 may be disposed just beside the active matrix circuit unit 605 and the scan signal monitor pad unit 660 may be disposed beside the scan driving unit 610.

The first and second data driving units 620 and 630, the gamma voltage generating unit 640, the data output monitor pad unit 670, the timing control unit 650, and the interface pad unit 680 may be disposed in the lower region of the active matrix circuit unit 605. More particularly, the data output monitor pad unit 670 may be disposed just under the active matrix circuit unit 605, the first and second data driving units 620 and 630 and the gamma voltage generating unit 640 may be disposed under the data output monitor pad unit 670, and the interface pad unit 680 may be disposed under the first and second data driving units 620 and 630 and the gamma voltage generating unit 640. Further, the timing control unit 650 may be disposed in the region adjacent to the data output monitor pad unit 670 and the first data driving unit 620.

In the meantime, the arrangement form and the detailed locations of the circuits 610 to 680 disposed to be adjacent to the two sides of the active matrix circuit unit 605 are not limited by the circuit disposition illustrated in the drawing, and it will be apparent to those skilled in the art that the locations of the circuits 510 to 680 may be slightly changed according to requirements of a customer company, design matters of a fabricating company, or the like.

The micro LED display device of the second type may be formed by flip-chip bonding the micro LED panel 100 or 200 onto the CMOS backplane 600. In this case, the micro LED display device of the second type may be fabricated with a maximum of 1.22 inches.

The micro LED display device of the first type and the micro LED display device of the second type may be fabricated by changing only the left and right locations in the same fabricating process, so that a separate additional process is not required, and driving software is applicable by the development of single software through an up/down/left/right symmetric option. A size of a display may be enlarged by combining the micro LED display device of the first type and the micro LED display device of the second type.

Figure 10A:
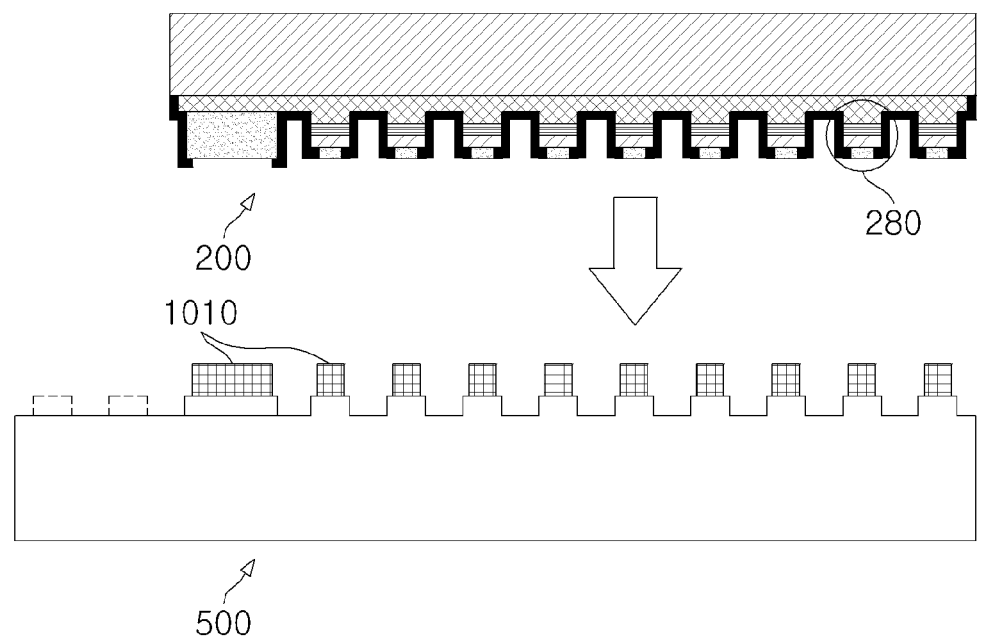
FIGS. 10A and 10B are a diagram illustrating a micro LED display device according to an exemplary embodiment of the present invention.
Figure 10B:
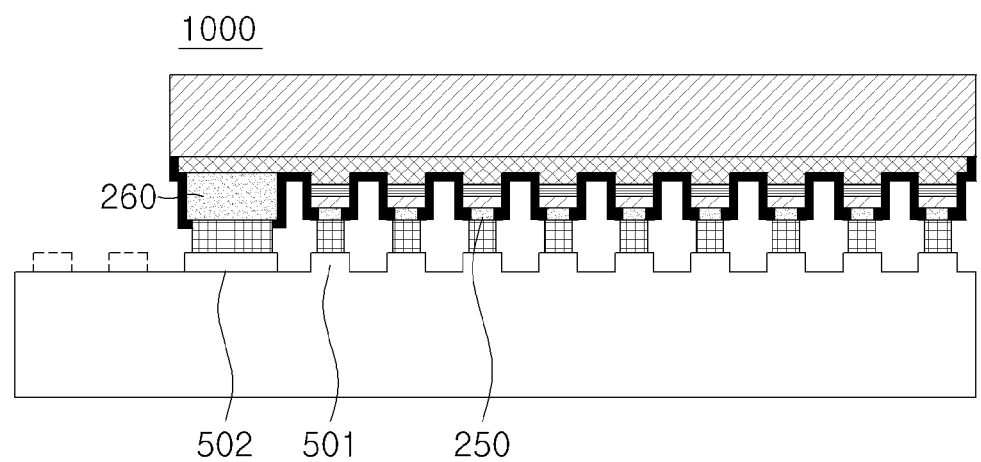

FIGS. 10A and 10B are a diagram illustrating a micro LED display device according to an exemplary embodiment of the present invention.

Referring to FIGS. 10A and 10B, the micro LED display device 1000 according to the exemplary embodiment of the present invention includes the micro LED panel 200, the CMOS backplane 500 in the first type, and bumps 1010. In this case, the CMOS backplane 500 in the first type may include the active matrix circuit unit 505, and the control circuit units 510 to 580 disposed in the regions adjacent to the left side and the lower side of the active matrix circuit unit 505.

The micro LED panel 200 includes a plurality of micro LED pixels 280, and the CMOS backplane 500 includes a plurality of CMOS cells 501 corresponding to the micro LED pixels for individually driving the plurality of micro LED pixels, respectively. In this case, a pixel region of the micro LED panel 200 may correspond to an AM region of the CMOS backplane 500.

The bumps 1010 electrically connect the micro LED pixels 280 and the CMOS cells 501 corresponding to the micro LED pixels 280, respectively, in the state where the micro LED pixels 280 and the CMOS cells 501 are disposed to face.

A fabricating process of the micro LED display device 1000 will be simply described. First, the plurality of bumps 1010 is disposed on the CMOS cells 501 and a common cell 502 of the CMOS backplane 500. Then, the CMOS cells 501 are in close contact with the micro LED pixels 280 by making the CMOS backplane 500 in the state where the plurality of bumps 1010 is disposed face the micro LED panel 200 and corresponding one-to-one the CMOS cells 501 and the micro LED pixels 280, and then heating is performed on the CMOS cells 501 and the micro LED pixels 280. Then, the plurality of bumps 1010 is melted, and as a result, the CMOS cells 501 and the corresponding micro LED pixels 280 are electrically connected, and the common cell 502 and the common electrode 260 of the micro LED panel 200 corresponding to the common cell 502 are electrically connected.

In the meantime, in the present exemplary embodiment, the case where the micro LED panel 200 of FIG. 4 is used in the micro LED display device 1000 is exemplified, but the present invention is not limited thereto, and it will be apparent to those skilled in the art that the micro LED panel 100 of FIG. 1 may be used in the micro LED display device 1000.

Figure 11A:
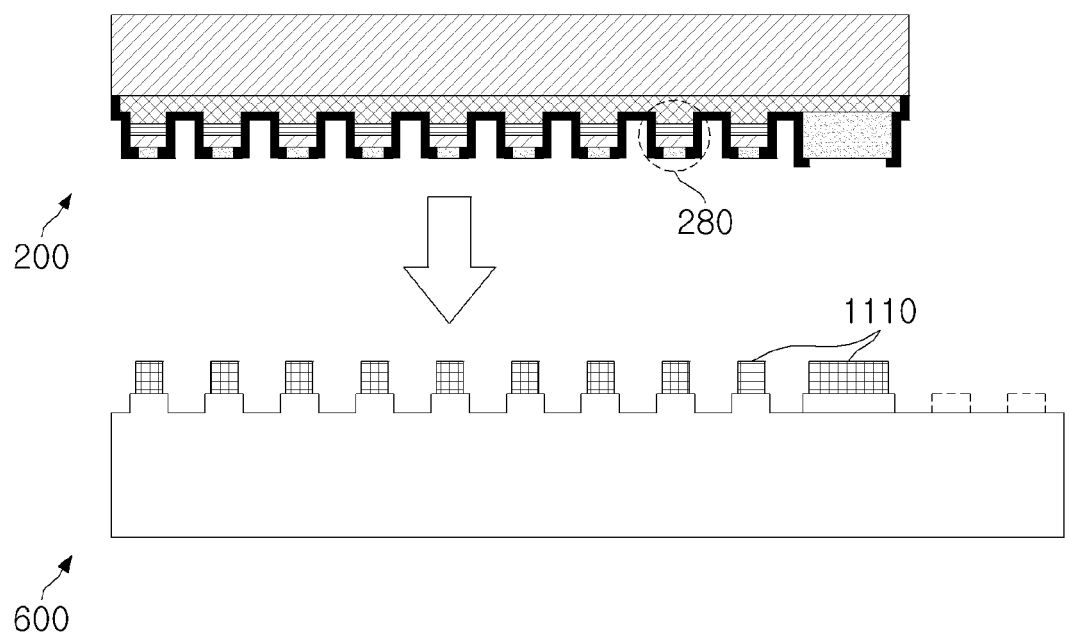
FIGS. 11A and 11B are a diagram illustrating a micro LED display device according to another exemplary embodiment of the present invention.
Figure 11B:
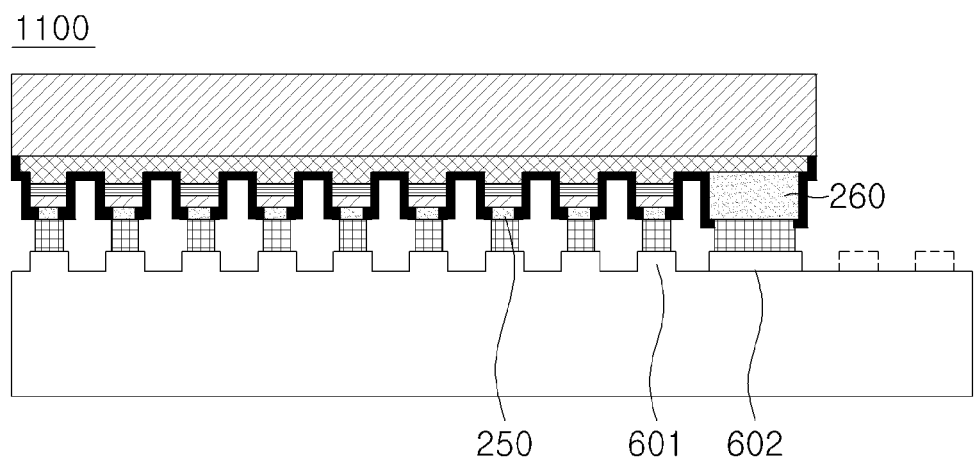

FIGS. 11A and 11B are a diagram illustrating a micro LED display device according to another exemplary embodiment of the present invention.

Referring to FIGS. 11A and 11B, a micro LED display device 1100 according to another exemplary embodiment of the present invention includes the micro LED panel 200, the CMOS backplane 600 in the second type, and bumps 1110. In this case, the CMOS backplane 600 in the second type may include the active matrix circuit unit 606, and the control circuit units 610 to 680 disposed in the regions adjacent to the right side and the lower side of the active matrix circuit unit 605.

The micro LED panel 200 includes a plurality of micro LED pixels 280, and the CMOS backplane 600 includes a plurality of CMOS cells 601 corresponding to the micro LED pixels for individually driving the plurality of micro LED pixels, respectively. Further, the bumps 1110 electrically connect the micro LED pixels 280 and the CMOS cells 601 corresponding to the micro LED pixels 280, respectively, in the state where the micro LED pixels 280 and the CMOS cells 601 are disposed to face.

A fabricating process of the micro LED display device 1110 will be simply described. First, the plurality of bumps 1110 is disposed on the CMOS cells 601 and a common cell 602 of the CMOS backplane 600. Then, the CMOS cells 601 are in close contact with the micro LED pixels 280 by making the CMOS backplane 600 in the state where the plurality of bumps 1110 is disposed face the micro LED panel 200 and corresponding one-to-one the CMOS cells 601 and the micro LED pixels 280, and then heating is performed on the CMOS cells 601 and the micro LED pixels 280. Then, the plurality of bumps 1110 is melted, and as a result, the CMOS cells 601 and the corresponding micro LED pixels 280 are electrically connected, and the common cell 602 and the common electrode 260 of the micro LED panel 200 corresponding to the common cell 602 are electrically connected.

Similarly, in the present exemplary embodiment, the case where the micro LED panel 200 of FIG. 4 is used in the micro LED display device 1100 is exemplified, but the present invention is not limited thereto, and it will be apparent to those skilled in the art that the micro LED panel 100 of FIG. 1 may be used in the micro LED display device 1100.

FIG. 12 is a diagram illustrating a micro LED display device in which a size of a display is enlarged two times in a horizontal direction.

Referring to FIG. 12, it is possible to implement a micro LED display device 10 in which a size of a display is enlarged two times by disposing the micro LED display device 1000 in the first type and the micro LED display device 1100 in the second type in a transverse direction (or a horizontal direction).

The enlarged micro LED display device 10 may be configured so that a first display area (or a first display panel) of the micro LED display device 1000 in the first type faces a second display area (or a second display panel) of the micro LED display device 1100 in the second type. In this case, the enlarged micro LED display device 10 may be configured so that a gap between the first display area and the second display area is minimized.

For example, a gap (or a distance) d between the first display area and the second display area may be determined by Equation 1 below.

$$d = 40 + 2\alpha + \beta \qquad \text{[Equation 1]}$$

Herein, 40 mm is a value obtained by summing a length (20 mm) of a border region of a first CMOS backplane and a length (20 mm) of a border region of a second CMOS backplane, α (mm) is a sawing error, and β (mm) is a module assembling margin.

As illustrated in FIGS. 4 and 5, when the common electrode (that is, the n electrode) is not formed in a connection portion between the first display area and the second display area, the micro LED display device 10 may be configured so that a gap between a border pixel of the first display area and a border pixel of the second display area corresponds to a pixel pitch. When the gap between the pixels is larger than a pixel pitch, it is possible to minimize the gap to a size of several micro meters (μm) which a person cannot visually recognize by using an optical system.

In the meantime, as illustrated in FIGS. 1 and 2, when the common electrode (that is, the n electrode) is formed in a connection portion between the first display area and the second display area, the micro LED display device 10 may be configured so that a gap of the connection portion except for the common electrode corresponds to a pixel pitch. Similarly, when the gap of the connection portion is larger than a pixel pitch, it is possible to minimize the gap to a size of several micro meters (μm) which a person cannot visually recognize by using an optical system.

As described above, it is possible to enlarge a size of the display two times by combining the micro LED display device 1000 in the first type and the micro LED display device 1100 in the second type in the horizontal direction.

Figure 13:
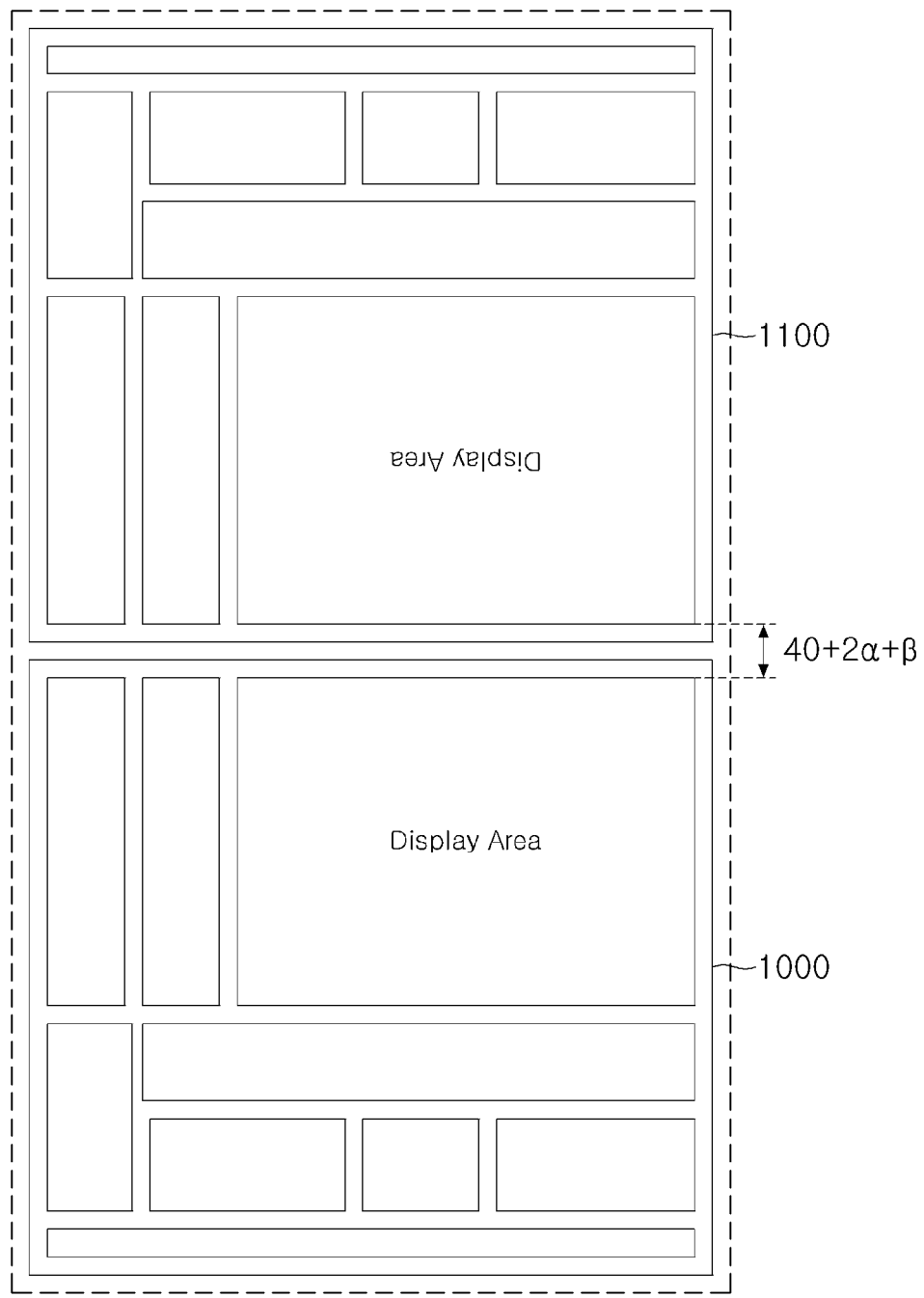
FIG. 13 is a diagram illustrating a micro LED display device in which a size of a display is enlarged two times in a vertical direction.

FIG. 13 is a diagram illustrating a micro LED display device in which a size of a display is enlarged two times in a vertical direction.

Referring to FIG. 13, it is possible to implement a micro LED display device 20 in which a size of a display is enlarged two times by disposing the micro LED display device 1000 in the first type and the micro LED display device 1100 in the second type in a longitudinal direction (or a vertical direction).

The enlarged micro LED display device 20 may be configured so that a first display area of the micro LED display device 1000 in the first type faces a second display area of the micro LED display device 1100 in the second type. In this case, the enlarged micro LED display device 20 may be configured so that a gap between the first display area and the second display area is minimized. For example, a gap d between the first display area and the second display area may be determined by Equation 1.

As illustrated in FIGS. 4 and 5, when the common electrode (that is, the n electrode) is not formed in a connection portion between the first display area and the second display area, the micro LED display device 20 may be configured so that a gap between a border pixel of the first display area and a border pixel of the second display area corresponds to a pixel pitch. In the meantime, as illustrated in FIGS. 1 and 2, when the common electrode (that is, the n electrode) is formed in a connection portion between the first display area and the second display area, the micro LED display device 20 may be configured so that a gap of the connection portion except for the common electrode corresponds to a pixel pitch.

As described above, it is possible to enlarge a size of the display two times by combining the micro LED display device 1000 in the first type and the micro LED display device 1100 in the second type in the horizontal direction.

Figure 14:
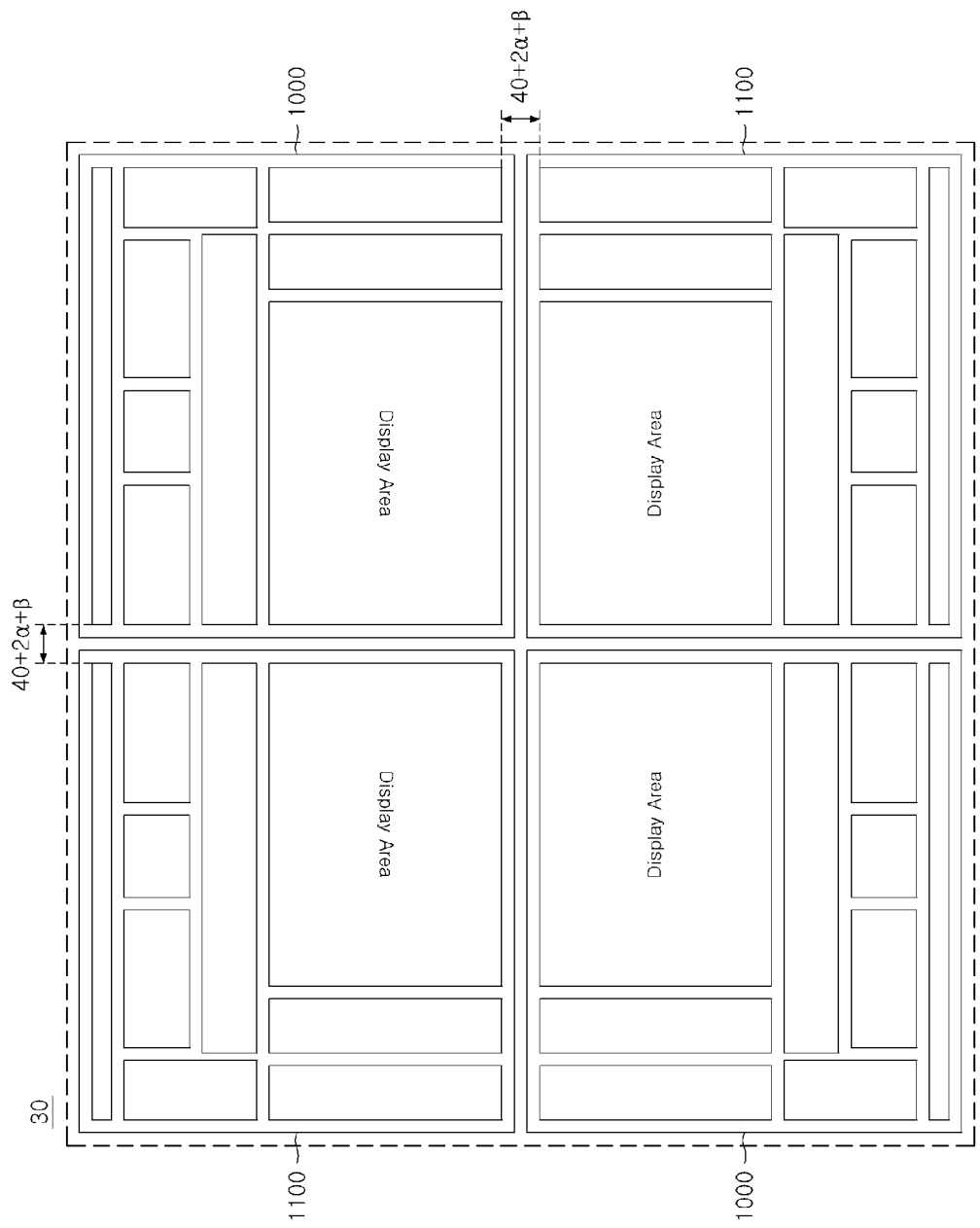
FIG. 14 is a diagram illustrating a micro LED display device in which a size of a display is enlarged four times.

FIG. 14 is a diagram illustrating a micro LED display device in which a size of a display is enlarged four times.

Referring to FIG. 14, it is possible to implement a micro LED display device 30 in which a size of a display is enlarged four times by arranging the two micro LED display devices 1000 in the first type and the two micro LED display devices 1100 in the second type in a matrix form.

In the matrix arrangement structure, the micro LED display devices 1000 in the first type may be disposed in a first diagonal direction of the enlarged micro LED display device 30 and the micro LED display devices 1100 in the second type may be disposed in a second diagonal direction of the enlarged micro LED display device 30.

Any one of the micro LED display devices 1000 in the first type positioned in the first diagonal direction may be disposed by rotating another micro LED display device 1000 in the same type by 180°. Further, any one of the micro LED display devices 1100 in the second type positioned in the second diagonal direction may be disposed by rotating another micro LED display device 1100 in the same type by 180°.

The enlarged micro LED display device 30 may be configured so that the first display areas of the micro LED display device 1000 in the first type face the second display areas of the micro LED display device 1100 in the second type. In this case, the enlarged micro LED display device 30 may be configured so that a gap between the first display area and the second display area is minimized. For example, a gap d between the first display area and the second display area may be determined by Equation 1.

As illustrated in FIGS. 4 and 5, when the common electrode (that is, the n electrode) is not formed in a connection portion between the first display area and the second display area, the micro LED display device 30 may be configured so that a gap between a border pixel of the first display area and a border pixel of the second display area corresponds to a pixel pitch. In the meantime, as illustrated in FIGS. 1 and 2, when the common electrode (that is, the n electrode) is formed in a connection portion between the first display area and the second display area, the micro LED display device 30 may be configured so that a gap of the connection portion except for the common electrode corresponds to a pixel pitch.

As described above, it is possible to enlarge a size of the display four times by switching directions of the micro LED display devices 1000 in the first type and the micro LED display devices 1100 in the second type and combining the micro LED display devices 1000 in the first type and the micro LED display devices 1100 in the second type.

In the meantime, in the foregoing, the particular exemplary embodiments of the present invention have been described, but may be variously modified without departing from the scope of the invention as a matter of course. Accordingly, the scope of the present invention is not limited to the exemplary embodiment, and should be defined in equivalents of the claims, as well as the claims to be described below.

What is claimed is:

1. A micro light emitting diode (LED) display device, comprising:
a first-type micro LED display module including a first micro LED driving substrate (backplane) and a first micro LED panel disposed on the first micro LED driving substrate;
a second-type micro LED display module including a second micro LED driving substrate (backplane) and a second micro LED panel disposed on the second micro LED driving substrate; and
control circuit units configured to be disposed in regions adjacent to two sides among four sides of each of the first and second micro LED panels, respectively,
wherein at least one side, except for the two sides among the four sides of the first micro LED panel is disposed to face at least one side, except for the two sides among the four sides of the second micro LED panel.

2. The micro LED display device of claim 1, wherein the first micro LED driving substrate includes a first active matrix (AM) circuit unit including a plurality of complementary metal oxide semiconductor (CMOS) cells corresponding to micro LED pixels of the first micro LED panel, and a first control circuit unit disposed in an outer region of the first AM circuit unit.

3. The micro LED display device of claim 2, wherein the first control circuit unit is disposed in a region adjacent to a first side and a second side of the first AM circuit unit.

4. The micro LED display device of claim 1, wherein the second micro LED driving substrate includes a second AM circuit unit including a plurality of CMOS cells corresponding to micro LED pixels of the second micro LED panel, and a second control circuit unit disposed in an outer region of the second AM circuit unit.

5. The micro LED display device of claim 4, wherein the second control circuit unit is disposed in a region adjacent to a first side and a second side of the second AM circuit unit.

6. The micro LED display device of claim 1, wherein the first and second micro LED panels are flip-chip bonded onto the first and second micro LED driving substrates, respectively.

7. The micro LED display device of claim 6, wherein the first and second-type micro LED display modules further include a plurality of bumps, which electrically connects the micro LED pixels of the first and second micro LED panels and the CMOS cells of the first and second micro LED driving substrates, respectively.

8. The micro LED display device of claim 7, wherein the plurality of bumps is formed in the plurality of CMOS cells, respectively, and is melted by heating, so that the CMOS cells and the micro LED pixels corresponding to the CMOS cells are electrically connected, respectively.

9. The micro LED display device of claim 1, wherein each of the micro LED pixels of the first and second micro LED panels is formed by sequentially growing a first conductive semiconductor layer, an active layer, and a second conductive semiconductor layer on a substrate and then etching the first conductive semiconductor layer, the active layer, and the second conductive semiconductor layer, and has a vertical structure sequentially including the first conductive semiconductor layer, the active layer, and the second conductive semiconductor layer, and in portions, in which the micro LED pixels are not formed, the active layer and the second conductive semiconductor layers are removed, so that the first conductive semiconductor layer is exposed.

10. The micro LED display device of claim 9, wherein on the first conductive semiconductor layer in the portions, in which the micro LED pixels are not formed, a first conductive metal layer is formed while being spaced apart from the micro LED pixels.

11. The micro LED display device of claim 10, wherein the first conductive metal layer is formed along an outer portion of the first or second micro LED panels on the first conductive semiconductor layer.

12. The micro LED display device of claim 10, wherein the first conductive metal layer functions as a common electrode of the micro LED pixels.

13. The micro LED display device of claim 10, wherein each of the first and second micro LED driving substrates includes a common cell formed to correspond to the first conductive metal layer, and the first conductive metal layer and the common cell are electrically connected by a bump.

14. The micro LED display device of claim 10, wherein the first conductive metal layer is a common electrode, and is disposed on two sides of each of the first and second micro LED panels corresponding to the disposition of the control circuit units.

15. The micro LED display device of claim 9, wherein the first conductive type is an n-type and the second conductive type is a p-type.

16. The micro LED display device of claim 1, wherein the control circuit unit includes at least one of a scan driving unit, a first data driving unit, a second data driving unit, a gamma voltage generating unit, a timing control unit, a scan signal monitor pad unit, a data output monitor pad unit, an interface pad unit.

17. The micro LED display device of claim 1, wherein a spaced distance between the first micro LED panel and the second micro LED panel is determined by:

$$d = 40 + 2\alpha + \beta$$

wherein 40 (mm) is a value obtained by summing lengths (20 mm) of border regions of the first and second micro LED driving substrates, a (mm) is an error of sawing, and b (mm) is a module assembly margin.

18. The micro LED display device of claim 1, wherein when a common electrode is not formed in a connection portion between the first micro LED panel and the second micro LED panel, a gap between a pixel of a border of the first micro LED panel and a pixel of a border of the second micro LED panel is formed to correspond to a pixel pitch.

19. The micro LED display device of claim 1, wherein when a common electrode is formed in a connection portion between the first micro LED panel and the second micro LED panel, a gap between a pixel of a border of the first micro LED panel and a pixel of a border of the second micro LED panel except for the common electrode is formed to correspond to a pixel pitch.

20. The micro LED display device of claim 1, wherein the first and second-type micro LED display modules are horizontally or vertically arranged.

* * * * *